United States Patent
Gopinath et al.

(10) Patent No.: US 12,190,930 B2
(45) Date of Patent: Jan. 7, 2025

(54) THRESHOLD VOLTAGE-PROGRAMMABLE FIELD EFFECT TRANSISTOR-BASED MEMORY CELLS AND LOOK-UP TABLE IMPLEMENTED USING THE MEMORY CELLS

(71) Applicant: GlobalFoundries U.S. Inc., Malta, NY (US)

(72) Inventors: Venkatesh P. Gopinath, Freemont, CA (US); Pirooz Parvarandeh, Los Altos Hills, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/607,725

(22) Filed: Mar. 18, 2024

(65) Prior Publication Data

US 2024/0221810 A1    Jul. 4, 2024

Related U.S. Application Data

(62) Division of application No. 17/671,652, filed on Feb. 15, 2022, now Pat. No. 11,990,171.

(51) Int. Cl.
*G11C 11/22* (2006.01)

(52) U.S. Cl.
CPC ........ *G11C 11/223* (2013.01); *G11C 11/2273* (2013.01); *G11C 11/2275* (2013.01)

(58) Field of Classification Search
CPC .............................. G11C 11/223; G11C 11/22
(Continued)

(56) References Cited

U.S. PATENT DOCUMENTS 7,321,237 B2    1/2008   McCollum et al.
8,988,104 B2 *  3/2015   Wang ................... H03K 19/173
                                                326/38
(Continued)

OTHER PUBLICATIONS

Breyer et al., "Compact FeFET Circuit Building Blocks for Fast and Efficient Nonvolatile Logic-in-Memory," Journal of the Electron Devices Society, Published Apr. 10, 2020, 9 pages.*

(Continued)

*Primary Examiner* — Muna A Techane
(74) *Attorney, Agent, or Firm* — David Cain; Hoffman Warnick LLC

(57) ABSTRACT

Disclosed is threshold voltage (VT)-programmable field effect transistor (FET)-based memory cell including a first transistor and a second transistor (which has an electric-field based programmable VT) connected in series between two voltage source lines. The gates of the transistors are connected to different wordlines and a sense node is at the junction between the two transistors. In preferred embodiments, the first transistor is a PFET and the second transistor is an NFET. Different operating modes (e.g., write 0 or 1 and read) are achieved using specific combinations of voltage pulses on the wordlines and voltage source lines. The memory cell is non-volatile, exhibits relatively low leakage, and has a relatively small footprint as compared to a conventional memory cell. Also disclosed are a look-up table (LUT) incorporating multiple threshold voltage (VT)-programmable field effect transistor (FET)-based memory cells and associated methods.

20 Claims, 16 Drawing Sheets

(58) Field of Classification Search
USPC .......................................................... 365/154
See application file for complete search history.

(56) References Cited

U.S. PATENT DOCUMENTS

| | | | |
|---|---|---|---|
| 9,991,894 B2 | 6/2018 | Greene et al. | |
| 2017/0178712 A1* | 6/2017 | Van Houdt | G11C 16/0475 |
| 2019/0012593 A1* | 1/2019 | Obradovic | G06N 3/063 |
| 2019/0273087 A1* | 9/2019 | Morris | G11C 11/223 |
| 2023/0049605 A1* | 2/2023 | Tomiie | G11C 16/3445 |

OTHER PUBLICATIONS

Chen et al., "Power and Area Efficient FPGA Building Blocks Based on Ferroelectric FETs," IEEE Transactions on Circuits and Systems—Regular Papers, vol. 66, No. 5, May 2019, 14 pages.*

Salehi et al., "Clockless Spin-based Look-Up Tables with Wide Read Margin," In Proceedings of the 2019 on Great Lakes Symposium on VLSI, pp. 363-366.*

Marchand et al., "FeFET based Logic-in-Memory: an overview," 16th International Conference on Design & Technology of Integrated Systems in Nanoscale Era (DTIS), Jun. 2021, 7 pages.*

Xie et al., "Non-Volatile Look-up Table Based FPGA Implementations," IEEE 2016 11th International Design & Test Symposium (IDT), pp. 165-170).

* cited by examiner

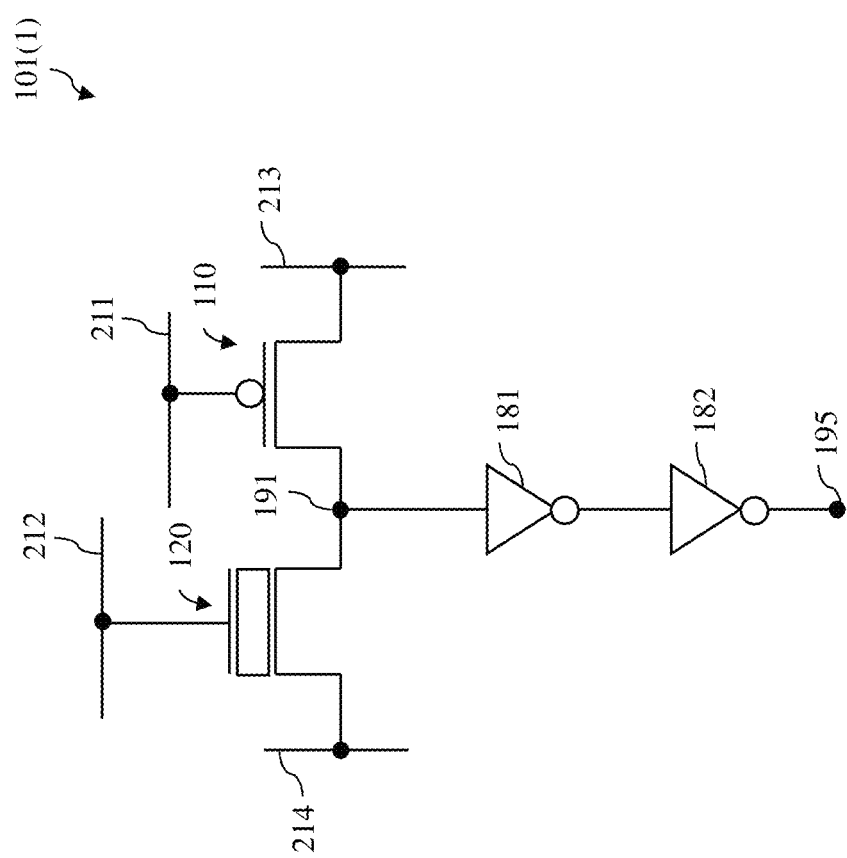
FIG. 1.1

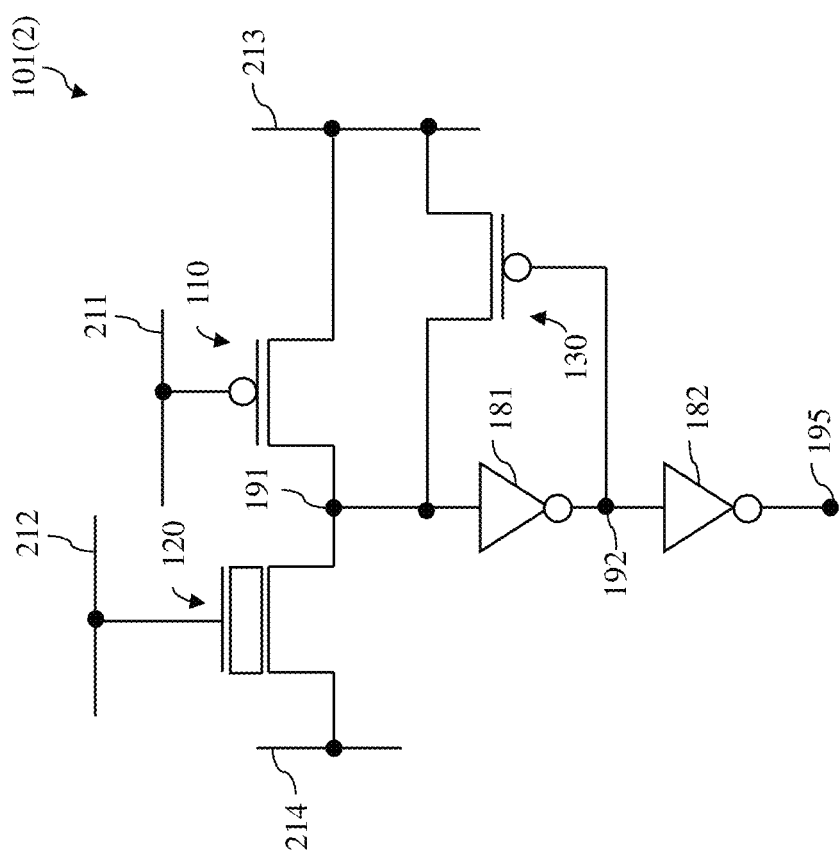
FIG. 1.2

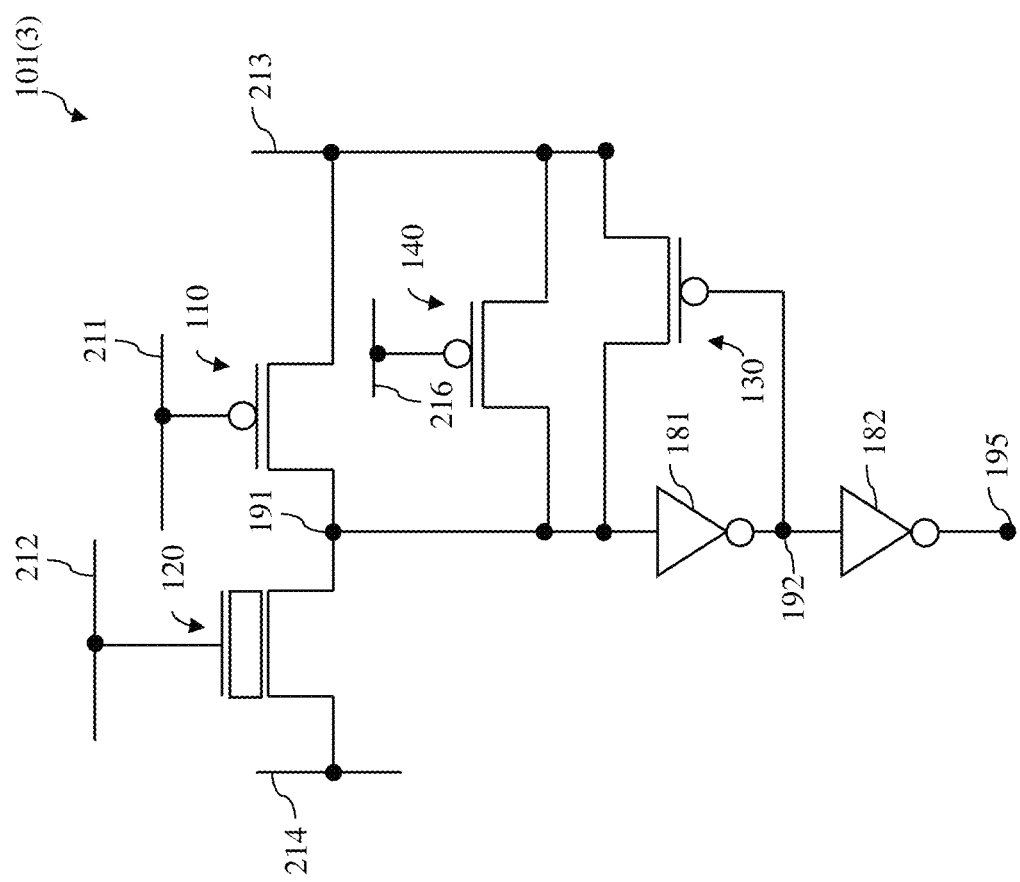
FIG. 1.3

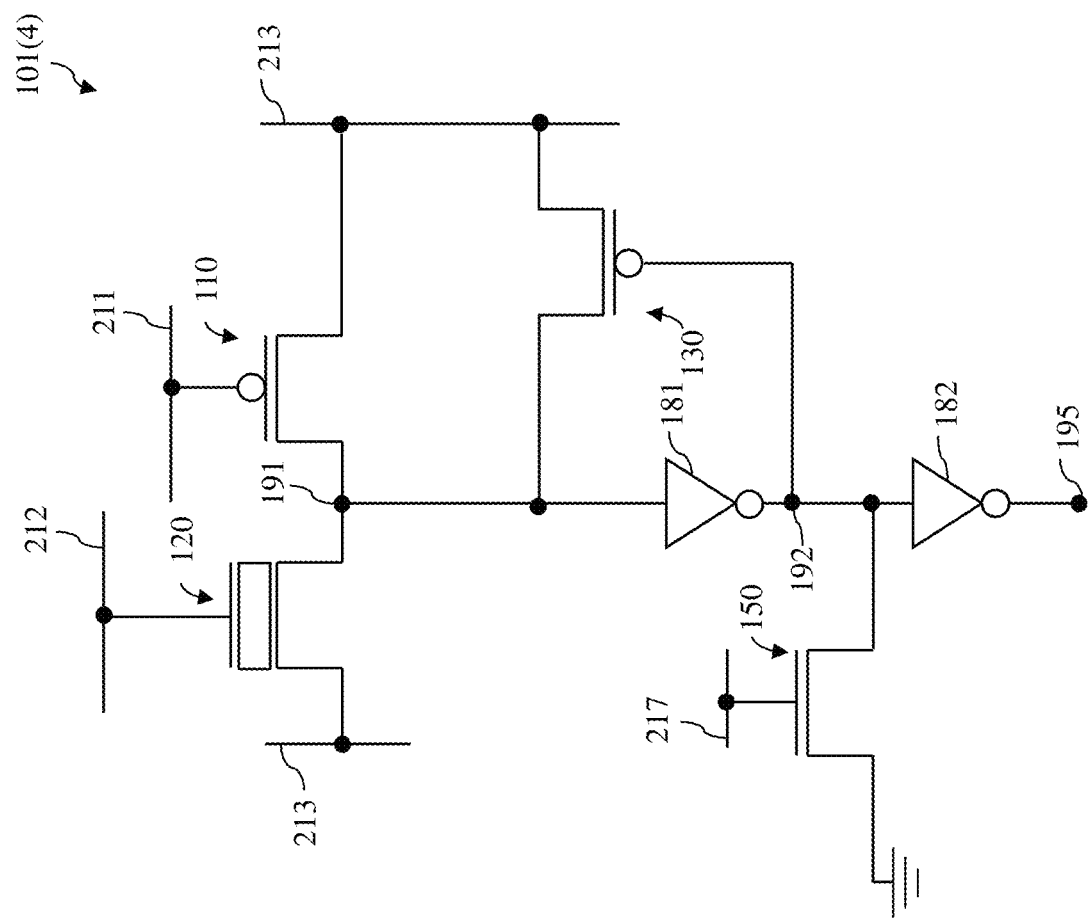
FIG. 1.4

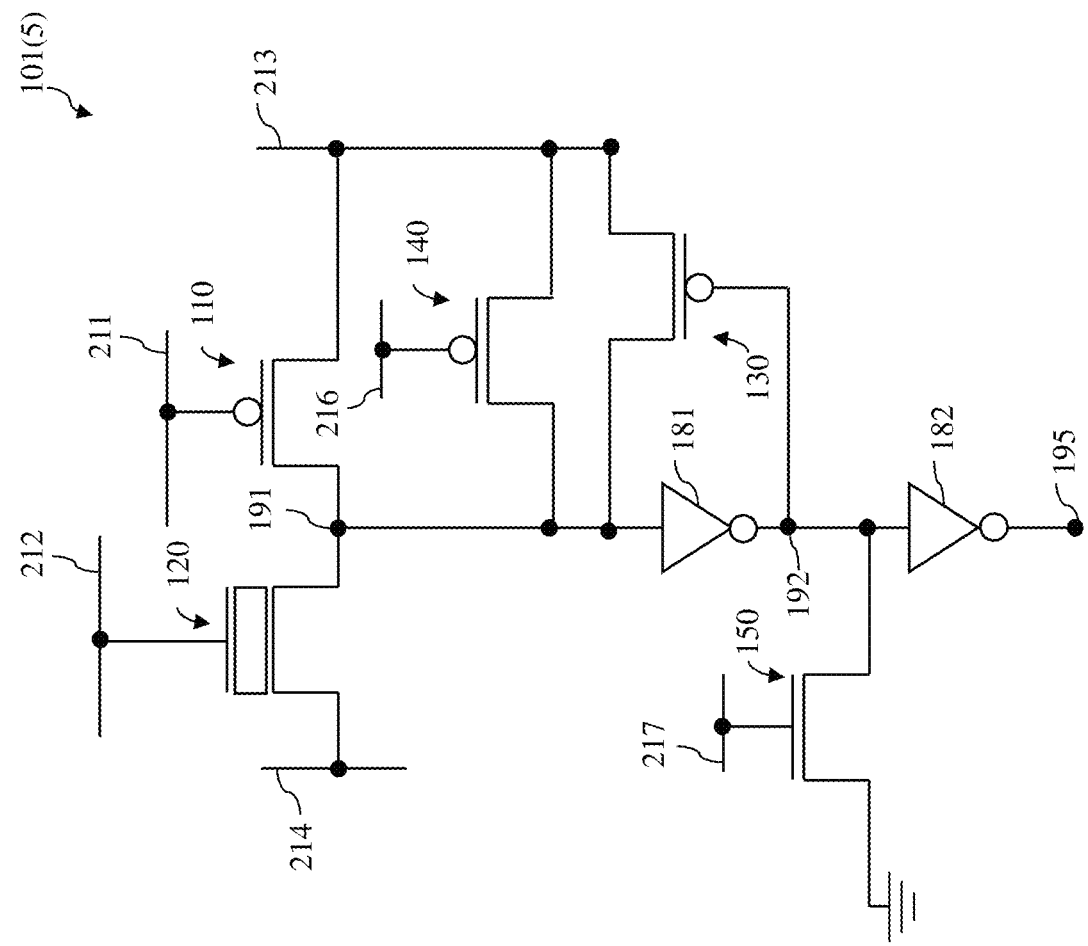
FIG. 1.5

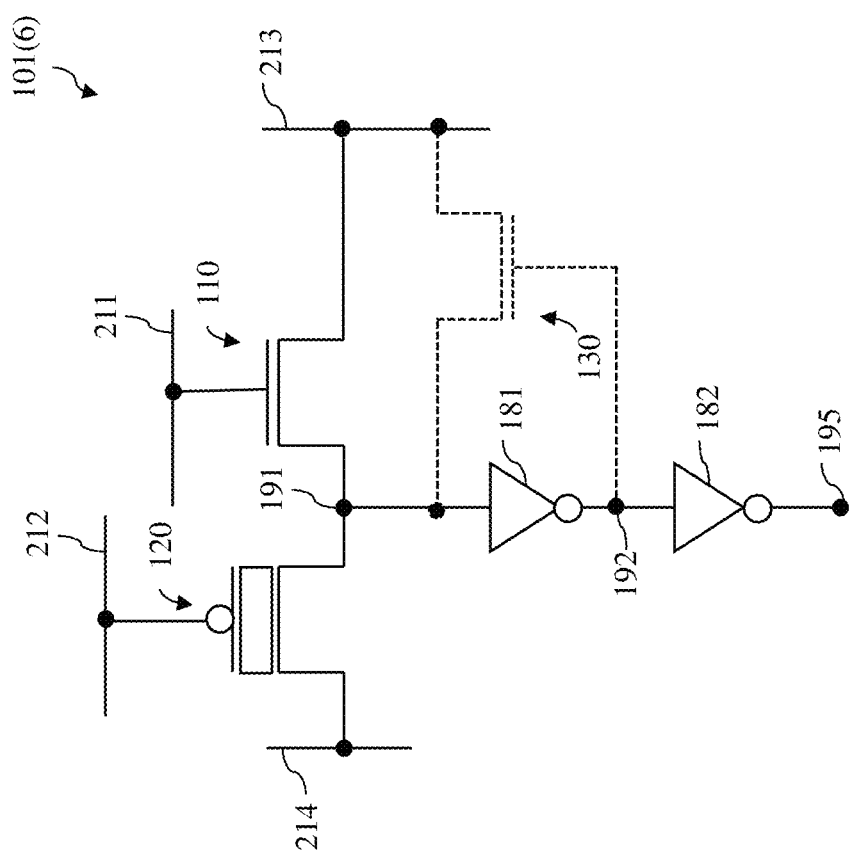
FIG. 1.6

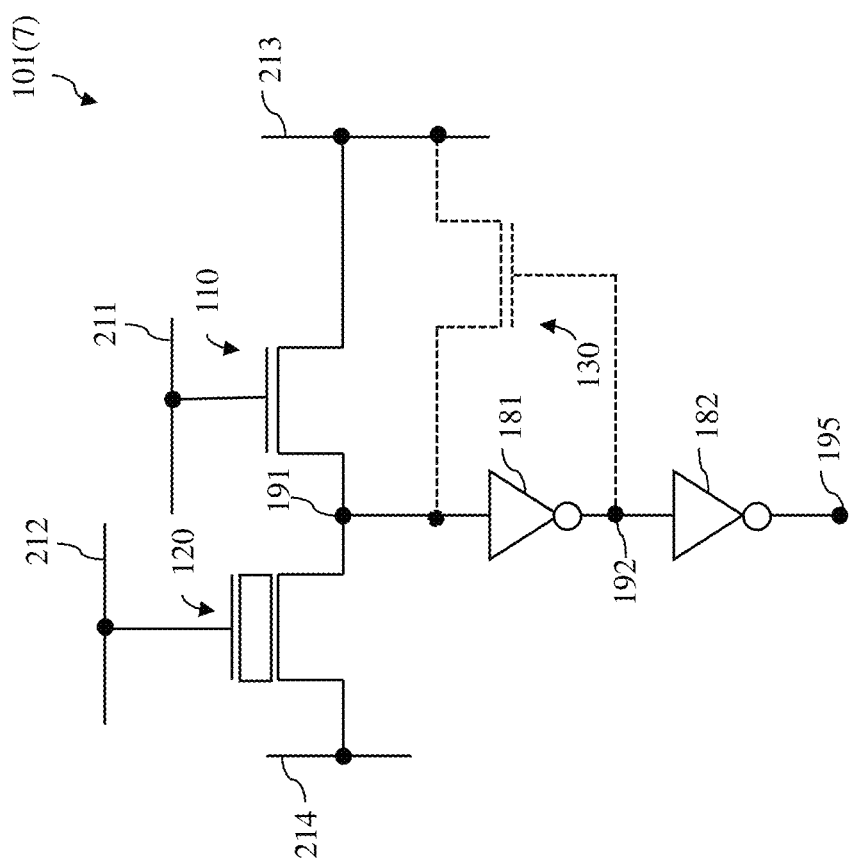
FIG. 1.7

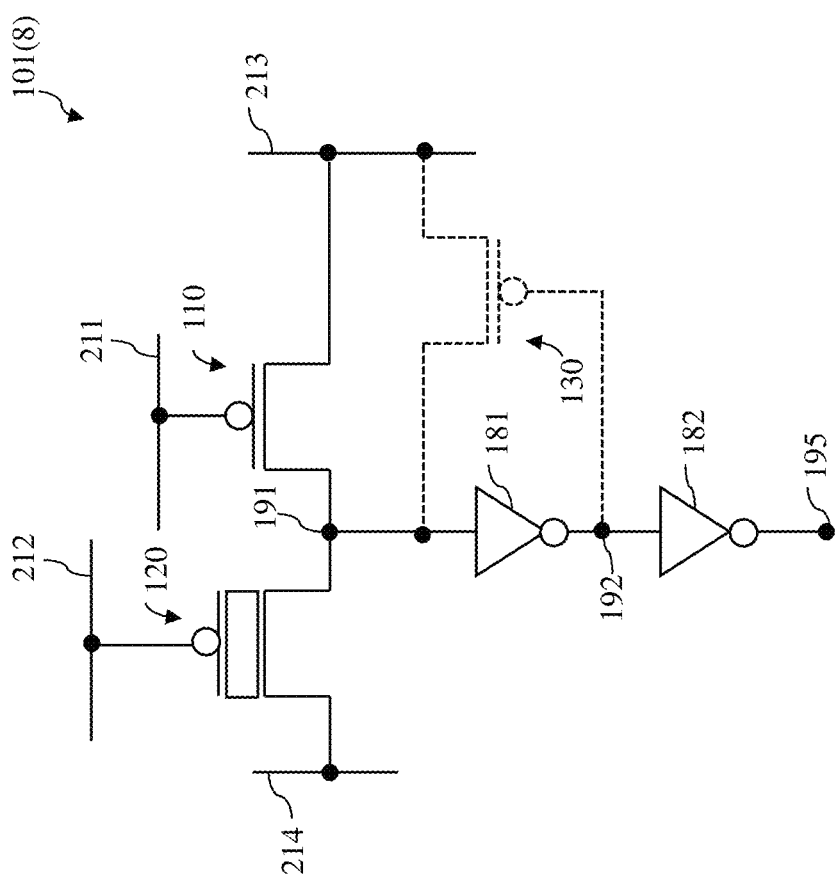
FIG. 1.8

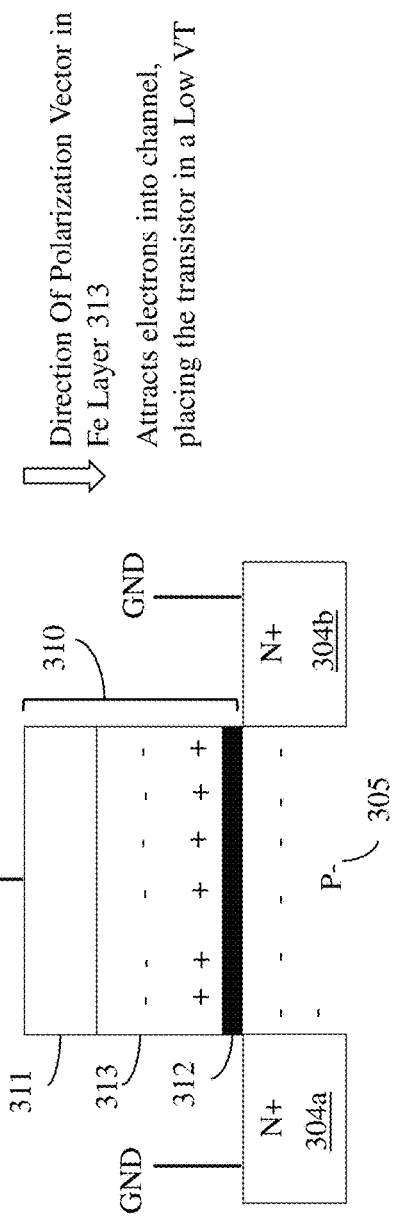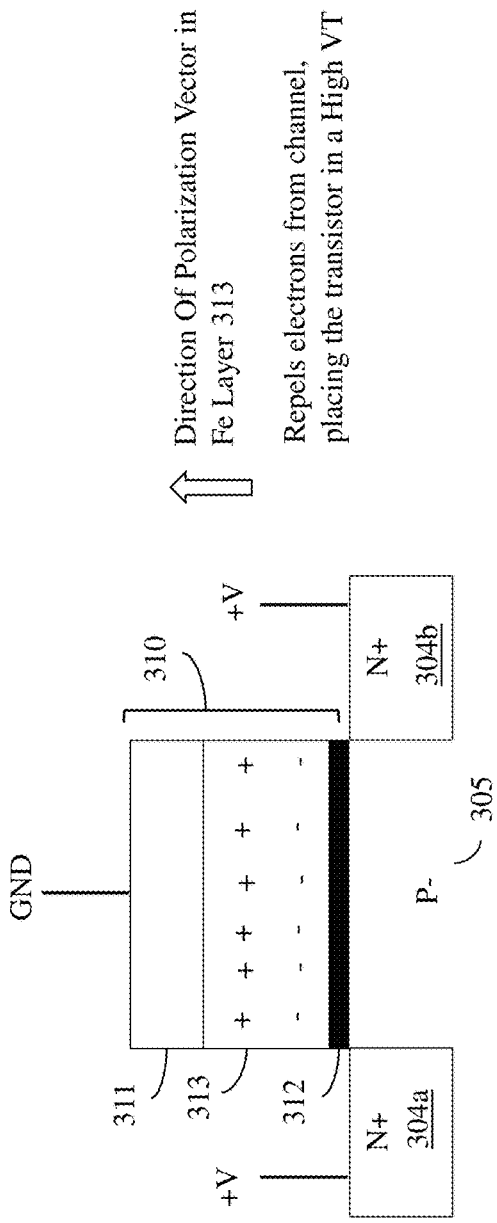

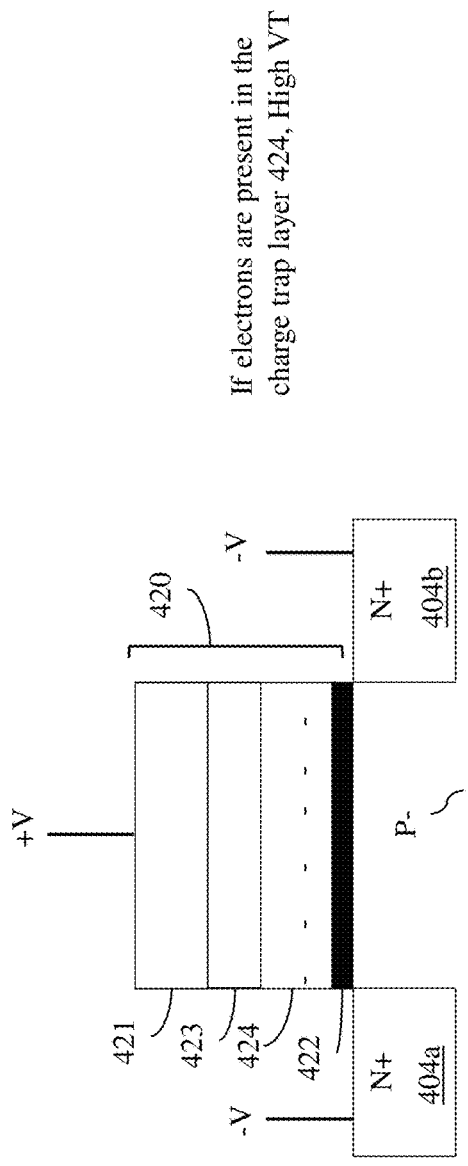
FIG. 4A — If electrons are not present in the charge trap layer 424, Low VT
FIG. 4B — If electrons are present in the charge trap layer 424, High VT

THRESHOLD VOLTAGE-PROGRAMMABLE FIELD EFFECT TRANSISTOR-BASED MEMORY CELLS AND LOOK-UP TABLE IMPLEMENTED USING THE MEMORY CELLS

BACKGROUND

Field of the Invention

The present invention relates to memory cells and, more particularly, to embodiments of a memory cell, to embodiments of a look-up table (LUT) implemented using the memory cell, and to embodiments of associated methods.

Description of Related Art

Field programmable gate arrays (FPGAs) often include look-up table(s) (LUTs) that are implemented using static random access memory (SRAM) cells. Such SRAM cells are volatile, relatively large, and associated with significant power consumption (e.g., due to excessive leakage current). Since key factors considered in modern integrated circuit design include, but are not limited to, size scaling, power scaling and performance, it would be advantageous to design a LUT that consumes less area and power and that incorporates non-volatile memory cells.

SUMMARY

Disclosed herein are embodiments of a structure (e.g., a threshold voltage (VT)-programmable field effect transistor (FET)-based memory cell). The structure can include a first transistor. The memory cell can further include a second transistor with an electric field-based programmable threshold voltage. The first transistor and the second transistor can be connected in series between a first voltage source line and a second voltage source line. The memory cell can further include: a sense node at a junction between the first transistor and the second transistor.

Also disclosed herein are embodiments of another structure (e.g., a look-up table (LUT) that is implemented using multiple threshold voltage (VT)-programmable field effect transistor (FET)-based memory cells). Specifically, the structure can include a multiplexing circuit. The multiplexing circuit can include multiple data line inputs, multiple select line inputs, and a multiplexing circuit output node. The structure can further include multiple memory cells. Each memory cell can include a first transistor and a second transistor. The second transistor can have an electric field-based programmable threshold voltage. The first transistor and the second transistor can be connected in series between a first voltage source line and a second voltage source line. Each memory cell can further include a sense node at the junction between the first transistor and the second transistor and a memory cell output node. Each memory cell can further include a first inverter and a second inverter connected in series between the sense node and the memory cell output node and the memory cell output node can be connected to a corresponding one of the data line inputs of the multiplexing circuit.

Also disclosed herein are method embodiments for operating the disclosed structure embodiments. For example, disclosed in a method embodiment of operating a threshold voltage (VT)-programmable field effect transistor (FET)-based memory cell. The method can include causing a memory cell, as described above, to operate in one of a first write mode and a second write mode. Operation in the first write mode programs the second transistor to have a first threshold voltage for storage of a first data value. Operation in the second write mode programs the second transistor to have a second threshold voltage that is different from the first threshold voltage for storage of a second data value. The method can further include causing the memory cell to operate in a read mode. During the read mode, the voltage level on the sense node will indicate whether the second transistor has either the first threshold voltage indicating storage of the first data value or the second threshold voltage indicating storage of the second data value.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 1.1, 1.2, 1.3, 1.4, 1.5, 1.6, 1.7 and 1.8 are schematic diagrams illustrating various disclosed embodiments of a threshold voltage (VT)-programmable field effect transistor (FET)-based memory cell;

FIGS. 3A and 3B are cross-section diagrams illustrating an exemplary N-type ferroelectric field effect transistor (FeFET) in a low threshold voltage (VT) state and a high VT state, respectively;

FIGS. 4A and 4B are cross-section diagrams illustrating an exemplary N-type charge trap field effect transistor (CTFET) in a low threshold voltage (VT) state and a high VT state, respectively;

DETAILED DESCRIPTION

Figure 2:
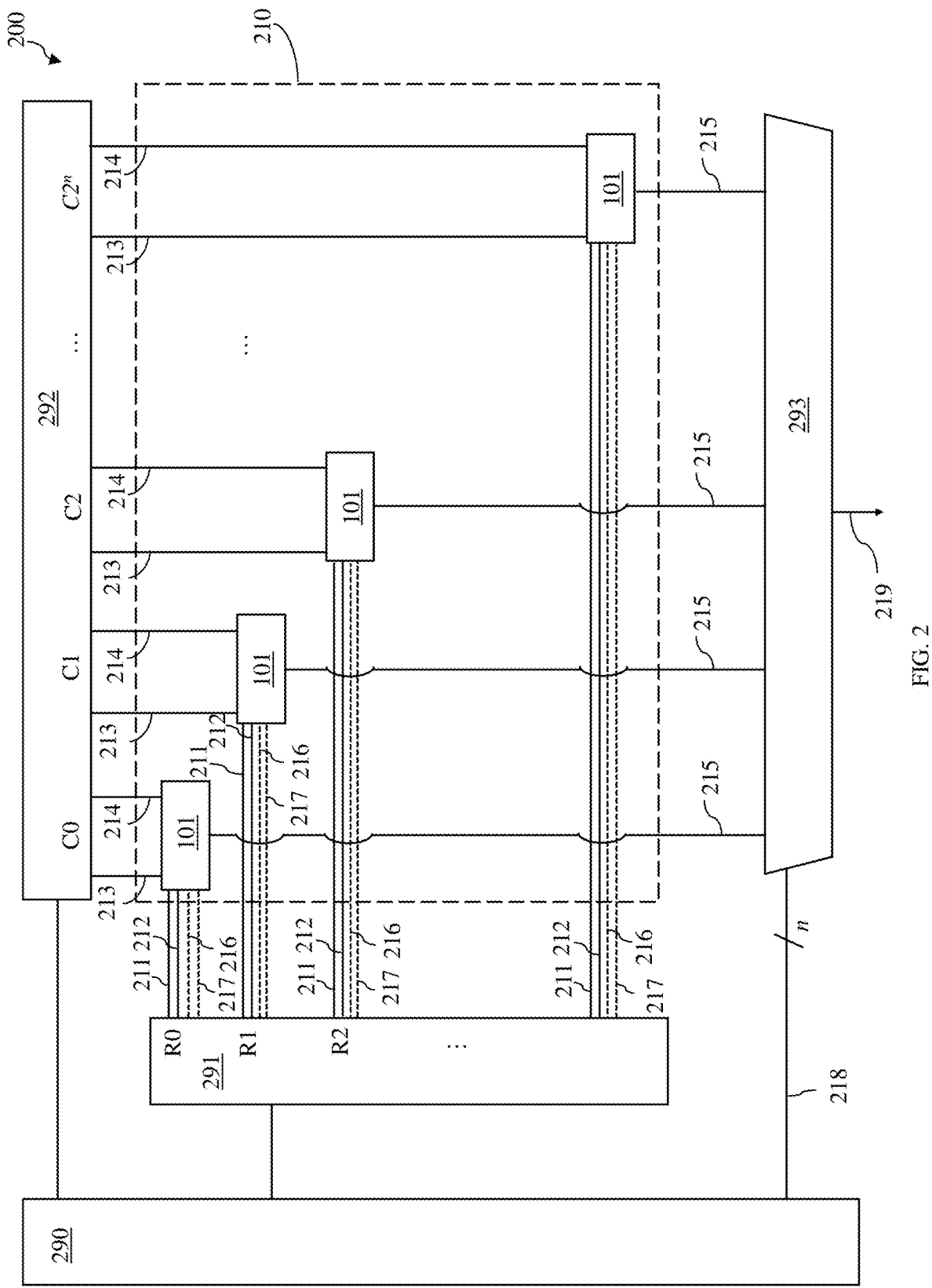
FIG. 2 is a schematic diagram illustrating a disclosed embodiment of a look-up table (LUT) incorporating multiple instances of any of the threshold voltage (VT)-programmable field effect transistor (FET)-based memory cells of FIGS. 1.1-1.8.

A field programmable gate array (FPGA) is an integrated circuit (IC) designed to be configured by a customer or designer after manufacturing. A FPGA will include reconfigurable logic blocks, among other components. A reconfigurable logic block can include a look-up table (LUT), as opposed to a combinational logic circuit comprising one or more logic gates, for implementing a combinational logic function. The combinational logic function can be designed to receive a fixed number (n) of two or more inputs (e.g., single-bit inputs of 1's and/or 0's) and to output at least one output (e.g., a single-bit output of 1 or 0) according to a truth table, which is associated with the combinational logic function and which specifies each output (i.e., 1 or 0) of the output for each combinations of inputs. The LUT is a circuit that includes a set of memory cells and a multiplexing circuit. Generally, the size of an LUT is determined by the number of inputs to the combinational logic function. For example, a combinational logic function with n inputs will require an LUT with $2^n$ memory cells and a $2^n$:1 multiplexer or the equivalent. Within the LUT, the output value for each possible combination of input values can be written to (i.e., stored in) the memory cells, respectively. The memory cells can be connected to data line inputs, respectively, of the multiplexing circuit. The multiplexing circuit can be configured to receive a specific combination of n inputs and, in response to the specific combination of n inputs, to output a corresponding output. In other words, the specific combination of n inputs functions as a select signal (or memory address signal) for reading out the data stored in a specific one of the memory cells. LUTs, such as those described above, are typically implemented using static random access memory (SRAM) cells. However, SRAM cells are volatile, relatively large, and associated with significant power consumption (e.g., due to excessive leakage current). Since key factors considered in modern integrated circuit design include, but are not limited to, size scaling, power scaling and performance, it would be advantageous to design an LUT that consumes less area and power and that includes non-volatile memory cells.

Disclosed herein are embodiments of a threshold voltage (VT)-programmable field effect transistor (FET)-based memory cell. The memory cell can include a first transistor and a second transistor connected in series between two voltage source lines. The second transistor can specifically have an electric field-based programmable threshold voltage (VT) for storing data. For example, it can be a ferroelectric FET (FeFET), a charge trap FET (CTFET) or any other FET configured for electric field-induced threshold voltage switching for storing data. The gates of the two transistors can be connected to different wordlines and a sense node can be at the junction between the two transistors. In preferred embodiments, the first transistor is a p-type field effect transistor (PFET) and the second transistor is an n-type field effect transistor (NFET). In alternative embodiments, the first and second transistors are an NFET and a PFET, respectively, both NFETs, or both PFETs. In any case, different operating modes (e.g., write 0, write 1, and read) can be achieved using specific combinations of voltage pulses on the wordlines and voltage source lines. The specific combinations of voltage pulses vary depending on the conductivity types of the first and second transistors and depending on the second transistor type (e.g., FeFET, CTFET, etc.). Because the second transistor has an electric field-based programmable VT for storing data, the memory cell is non-volatile. Furthermore, the memory cell exhibits relatively low leakage and has a relatively small footprint as compared to a conventional memory cell (e.g., static random access memory cell). Optionally, additional components can be incorporated into the memory cell to further improve performance and eliminate spurious outputs. Also disclosed are embodiments of a look-up table (LUT) incorporating multiple threshold voltage (VT)-programmable field effect transistor (FET)-based memory cells and embodiments of associated methods.

FIGS. 1.1, 1.2, 1.3, 1.4 and 1.5 are schematic diagrams illustrating preferred embodiments of a threshold voltage (VT)-programmable field effect transistor (FET)-based memory cell 101(1), 101(2), 101(3), 101(4) and 101(5), respectively. FIGS. 1.6, 1.7 and 1.8 are schematic diagrams illustrating alternative embodiments of a threshold voltage (VT)-programmable field effect transistor (FET)-based memory cell 101(6), 101(7) and 101(8), respectively. FIG. 2 is a schematic diagram illustrating an exemplary LUT 200 that can incorporate multiple threshold voltage (VT)-programmable field effect transistor (FET)-based memory cells 101 and, more particularly, that can incorporate multiple instances of any of the memory cells 101(1)-101(8) illustrated in FIGS. 1.1-1.8 and described in detail below.

Specifically, referring to FIGS. 1.1-1.8, disclosed herein are embodiments of a threshold voltage (VT)-programmable field effect transistor (FET)-based memory cell 101(1)-101(8). In each of the embodiments, the memory cell 101(1)-101(8) can include a first transistor 110 and a second transistor 120 connected in series. In the preferred embodiments, the first transistor 110 is a p-type field effect transistor (PFET) and the second transistor 120 is an n-type field effect transistor (NFET) (e.g., see the memory cells 101(1)-101(5) in FIGS. 1.1-1.5). In the alternative embodiments, the first transistor 110 can be an NFET and the second transistor 120 can be a PFET (e.g., see the memory cell 101(6) of FIG. 1.6), the first transistor 110 and the second transistor 120 can both be NFETs (e.g., see the memory cells 101(7) in FIG. 1.7), or the first transistor 110 and the second transistor 120 can both be PFETs (e.g., see the memory cell 101(8) in FIG. 1.8).

In any case, the first transistor 110 can be configured so as to have a specific (i.e., non-programmable) threshold voltage (VT). For example, the first transistor 110 can have a conventional gate structure (e.g., a gate first polysilicon gate, a gate first metal gate, a replacement metal gate, etc.).

The second transistor 120 can be configured so as to have an electric field-based programmable threshold voltage. That is, the second transistor 120 can be configured for electric field-induced VT switching, where charge storage is the mechanism for data storage. Such transistors include, but are not limited to, ferroelectric field effect transistors (FeFETs) and charge trap field effect transistors (CTFETs).

More particularly, the second transistor 120 could be a FeFET, which has an electric-field based programmable VT. For example, in the memory cells 101(1)-101(5) and 101(7) of FIGS. 1.1-1.5 and 1.7, respectively, the second transistor 120 can be an N-type FeFET. Such an N-type FeFET can include N+ source/drain regions 304a-304b and a channel region 305 (e.g., an intrinsic or P-channel region, depending upon the process technology at issue) positioned between the N+ source/drain regions 304a-304b. The N-type FeFET can further include a gate 310 adjacent to the channel region 305. This gate 310 can be a multi-layered structure including, for example, a gate dielectric layer 312 on the channel region 305, a ferroelectric layer 313 (e.g., a hafnium oxide layer or some other suitable ferroelectric layer) on the gate dielectric layer 312, and a control gate layer 311 (e.g., a metal gate layer) on the ferroelectric layer 313. With such a gate 310, the N-type FeFET has an electric field-based programmable threshold voltage (VT). To achieve electric field-induced switching to a first VT (i.e., a low VT), a positive voltage pulse can be applied to the gate 310 and a ground voltage pulse can be applied to the N+ source/drain regions 304a-304b. This results in the direction of polarization vector of the ferroelectric layer 313 pointing toward the channel region 305 (i.e., it results in + poles of di-poles in the layer 313 being adjacent to the channel region 305 and − poles of the dipoles being adjacent to the control gate layer 311) such that electrons are attracted to the channel region 305, thereby creating a conductive region in the channel region 305 between the N+ source/drain regions 304a-303b and decreasing the VT (see FIG. 3A). To achieve electric field-induced switching to a second VT that is higher than the first VT (i.e., a high VT), a ground voltage pulse can be applied to the gate 310 and a positive voltage pulse can be applied to the N+ source/drain regions 304a-304b or, alternatively, a negative voltage pulse can be applied to the gate 310 and a ground voltage pulse can be applied to the N+ source/drain regions 304a-304b. Either way, this results in the direction of polarization vector of the ferroelectric layer 313 pointing toward the control gate layer 311 (i.e., it results in + poles of di-poles in the layer 313 being adjacent to the control gate layer 311 and − poles of the dipoles being adjacent to the channel region 305) such that electrons are repelled from channel region 405, thereby eliminating any conductive region between the N+ source/drain regions 304a-304b and increasing VT (see FIG. 3B).

As mentioned above, in the memory cells 101(6) and 101(8) of FIGS. 1.6 and 1.8, respectively, the second transistor 120 is a PFET. This PFET could similarly be a FeFET but with opposite polarities than an N-type FeFET, as described above and illustrated in FIGS. 3A-3B.

Alternatively, the second transistor 120 could be CTFET, which also has an electric field-based programmable VT.

For example, in the memory cells 101(1)-101(5) and 101(7) of FIGS. 1.1-1.5 and 1.7, respectively, the second transistor 120 can be an N-type CTFET. Such an N-type CTFET can include N+ source/drain regions 404a-404b and a channel region 405 (e.g., an intrinsic or P-channel region, depending upon the process technology at issue) positioned between the N+ source/drain regions 404a-404b. The N-type CTFET can further include a gate 420 adjacent to the channel region 405. The gate 420 can be a multi-layered structure including, for example, a gate dielectric layer 422 on the channel region 405, a charge trap layer 424 (e.g., a silicon nitride layer) on the gate dielectric layer 422, another gate dielectric layer 423 on the charge trap layer 424 and a control gate layer 421 (e.g., a metal gate layer) on the gate dielectric layer 423. With such a gate 420, the N-type CTFET has an electric field-based programmable threshold voltage (VT). To achieve electric field-induced switching to a first VT (i.e., a low VT), a negative voltage pulse can be applied to the gate 420 and a positive voltage pulse can be applied to the N+ source/drain regions 404a-404b. This results in electrons moving out of the charge trap layer 424, thereby decreasing the VT (see FIG. 4A). To achieve electric field-induced switching to a second VT that is higher than the first VT (i.e., a high VT), a positive voltage pulse can be applied to the gate 420 and a negative voltage pulse can be applied to the N+ source/drain regions 404a-404b. This results in electrons moving into and being trapped by the charge trap layer 424, thereby increasing the VT (see FIG. 4B).

As mentioned above, in the memory cells 101(6) and 101(8) of FIGS. 1.6 and 1.8, respectively, the second transistor 120 is a PFET. This PFET could similarly be a CTFET but with opposite polarities than an N-type FeFET, as described above and illustrated in FIGS. 4A-4B.

Alternatively, the second transistor 120 in the memory cells 101(1)-101(8) of FIGS. 1.1-1.8 could be any other suitable type of FET configured for electric field-induced threshold voltage switching.

In any case, each memory cell 101(1)-101(8) can further include: a sense node 191 at the junction between the first transistor 110 and the second transistor 120; and a pair of inverters (i.e., a first inverter 181 and a second inverter 182) connected in series between the sense node 191 and a memory cell output node 195. As mentioned above, in each memory cell 101(1)-101(8), the first transistor 110 and the second transistor 120 can be connected in series. Specifically, the first transistor 110 and the second transistor can be connected in series between a first voltage source line 213 and a second voltage source line 214. These two voltage source lines can both be variable voltage source lines. Additionally, in each memory cell 101(1)-101(8), the first transistor 110 can have a first gate connected to a first wordline 211 and the second transistor 120 can have a second gate connected to a second wordline 212.

Such a memory cell 101(1)-101(8) can operate in multiple different operating modes. These operating modes can include: a read mode to output a stored data value in the memory element to the memory cell output node 195; a first write mode (also referred to herein as a write 0 mode) to store a 0 data value in the memory element; and a second write mode (also referred to herein as a write 1 mode) to store a 1 data value in the memory element. Specific combinations of different voltage pulses can be applied to the first wordline 211, the second wordline 212, the first voltage source line 213, and the second voltage source line 214 connected to a given memory cell in order to achieve the different operating modes (i.e., the read mode, the first write mode, and the second write mode) in the given memory cell. Furthermore, the specific combinations of different voltage pulses will vary depending upon the conductivity types of the first and second transistors (e.g., PFET and NFET, as in the memory cells 101(1)-101(5) of FIGS. 1.1-1.5; NFET and PFET as in the memory cell 101(6) of FIG. 1.6; both NFETs as in the memory cell 101(7) of FIG. 1.7; or both PFETs as in the memory cell 101(8) of FIG. 1.8) and on the second transistor type (e.g., FeFET, CTFET, etc.).

For example, consider a memory cell where the first transistor 110 is a PFET and the second transistor 120 is an NFET (e.g., any of the memory cells 101(1)-101(5) of FIGS. 1.1-1.5) and where the second transistor 120 is specifically an N-type FeFET, as described above and illustrated in FIGS. 3A-3B.

In the read mode, the combination of voltage pulses applied to the first wordline 211, the second wordline 212, the first voltage source line 213, and the second voltage source line 214 can be set so as so that: (a) when the FeFET has a low VT (e.g., a VT of 0V), the voltage level on the sense node 191 is pulled down to a low voltage level, the output of the first inverter 181 is high, and the output of the second inverter 182 and, thereby the output on the memory cell output node 195 is low (i.e., indicating a stored 0 data value); and (b) when the FeFET has a high VT (e.g., a VT of 1.5V), the voltage level on the sense node 191 is pulled up to a high voltage level, the output of the first inverter 181 is low, and the output of the second inverter 182 and, thereby the output on the memory cell output node 195 is high (i.e., indicating a stored 1 data value). To accomplish this read mode, a first positive voltage pulse (e.g., a VDD pulse; e.g., a 1V pulse) can be applied to the first wordline 211, the second wordline 212, and the first voltage source line 213 and a ground voltage pulse (e.g., a VSS pulse, e.g., a 0V pulse) can be applied to the second voltage source line 214. As a result, the first transistor 110 (which as mentioned above is a PFET) turns off. Furthermore, if the second transistor 120 (which as mentioned above is a FeFET in this example) has the first VT (i.e., a low VT), the voltage level on the sense node 191 will be pulled down to a low voltage level; whereas, if the second transistor 120 has the second VT (i.e., a high VT), the voltage level on the sense node 191 will be pulled up to a high voltage level. It should be understood that the first transistor 110 should be sized so that, when it is turned off, it: (a) allows the voltage level on the sense node 191 to be pulled down when the second transistor 120 has the first VT (i.e., the low VT); and (b) pulls up the voltage level on the sense node 191 when the second transistor 120 has the second VT (i.e., the high VT).

In the first write mode (i.e., the write 0 mode), the combination of voltage pulses applied to the first wordline 211, the second wordline 212, the first voltage source line 213, and the second voltage source line 214 can be set so that electric field-induced switching to the first VT (i.e., to the low VT) occurs. To accomplish this first write mode, a second positive voltage pulse that is at a higher level than the first positive voltage pulse (e.g., a VDD+ pulse; e.g., a 2.5V pulse) can be applied to the second wordline 212 and a ground voltage pulse (e.g., a VSS pulse, e.g., a 0V pulse) can be applied to each of the first wordline 211, the first voltage source line 213, and the second voltage source line 214. As a result, the first transistor 110 is turned on and the FeFET-type second transistor 120 receives the ground voltage pulses on its N+ source/drain regions and the second positive voltage pulse on its gate such that it is programmed to have the first VT (i.e., the low VT, e.g., a VT of 0V).

In the second write mode (i.e., the write 1 mode), the combination of voltage pulses applied to the first wordline 211, the second wordline 212, the first voltage source line 213, and the second voltage source line 214 can be set so that electric field-induced switching to the second VT (i.e., to the high VT) occurs. To accomplish this second write mode, ground voltage pulses (e.g., VSS pulses, e.g., 0V pulses) can be the first wordline 211 and to the second wordline 212 and second positive voltage pulses (e.g., VDD+ pulses, e.g., 2.5V pulses) can be applied to the first voltage source line 213 and the second voltage source line 214. As a result, the first transistor 110 is turned on and the FeFET-type second transistor 120 receives the second positive voltage pulses on its N+ source/drain regions and the ground voltage pulse on its gate such that it is programmed to have the second VT (i.e., the high VT, e.g., a VT of 1.5V).

It should be understood that the specific combinations of different voltage pulses applied to the first wordline 211, the second wordline 212, the first voltage source line 213, and the second voltage source line 214 to achieve the read mode, the first write mode, or the second write mode will differ in embodiments where the first and second transistors have different conductivity types (e.g., if the first transistor and second transistor are instead an NFET and a PFET, both NFETs or both PFETs) and also in embodiments where the second transistor is a CTFET or some other type of FET with an electric field-based programmable threshold voltage (VT).

Additionally, it should be noted that in the embodiment of the memory cell 101(1) shown in FIG. 1.1, there are conditions during which the sense node 191 may be left floating. For example, the sense node 191 may be floating when the second transistor 120 has the high VT and when the voltage levels on both the first wordline 211 connected to the first gate of the first transistor 110 and the second wordline 212 connected to the second gate of the second transistor 120 are pulled high. In this case, the first transistor 110 can be off and the second transistor 120 can also be off due to its high VT. As a result, upon power up and potentially when the second transistor 120 has just been switched to the high VT state, a read error can occur. That is, even though the second transistor 120 has the high VT state, the voltage level at the sense node 191 may register low such that the output at the memory cell output node 195 is also low.

Various different techniques can be employed to avoid read errors due to a floating sense node 191.

For example, in any of the memory cells 101(1)-101(5) of FIGS. 1.1-1.5, at power up, immediately following switching of the second transistor 120 to the high VT state, or under any other conditions where it is anticipated that the sense node 191 may be floating, a relatively short duration ground voltage pulse could optionally be applied to the first wordline 211 and thereby to the first gate of the first transistor 110 (irrespective of the VT of the second transistor 120). As a result, the first transistor 110 is turned on for a sufficient amount of time to ensure that the voltage level on the sense node 191 is pulled up prior to any subsequent read operation.

In other embodiments, additional components can be included in the memory cell structure and used to avoid such read errors.

For example, referring specifically to the memory cells 101(2)-101(5) of FIGS. 1.2-1.5, in some embodiments, the memory cell can include a third transistor 130 (also referred to herein as a feedback transistor). In these embodiments, the third transistor 130 can specifically be an additional PFET, which is connected parallel with the first transistor 110 between the first voltage source line 213 and the sense node 191 (e.g., at the input to the first inverter 181). This third transistor 130 can further include a third gate, which is connected to an intermediate node 192 between the first inverter 181 and the second inverter 182 (i.e., at the output of the first inverter 181 and at the input of the second inverter 182). In other words, the third gate of this third transistor 130 is continuously biased by the voltage level on the intermediate node 192. In this case, third transistor 130 turns on, pulling up the voltage level of the sense node whenever the output of the first inverter 181 is low (i.e., acting as a keeper transistor keeping the sense node high) and turns off whenever the output of the first inverter 181 is high. It should be noted that the third transistor 130 should specifically be sized (e.g., with a narrow width and/or long channel) so that it pulls up the voltage level on the sense node 191 when the there is no pull down of the sense node 191 by the second transistor 120 and also when there is only weak pull down from the second transistor 120. Specifically, the third transistor 130 should be sized so that the first transistor 110 and the third transistor 130 in combination, overpower the second transistor 120 except when the second transistor 120 is on and has the low VT.

Additionally, referring specifically to the memory cells 101(3)-101(5) of FIGS. 1.3-1.5, in some embodiments, the memory cell can further include a fourth transistor 140 and/or a fifth transistor 150. For example, as illustrated in the memory cells 101(3) of FIGS. 1.3 and 101(5) of FIG. 1.5, the fourth transistor 140 can be yet another PFET, which is connected parallel with the first transistor 110 between the first voltage source line 213 and the sense node 191 (e.g., at the input to the first inverter 181). This fourth transistor 140 can further include a fourth gate, which is connected to a third wordline 216. In this case, at power up, immediately following switching of the second transistor 120 to the high VT state, or under any other conditions where it is anticipated that the sense node 191 may be floating, a relatively short duration ground voltage pulse could be applied to the third wordline 216 and thereby to the fourth gate of the fourth transistor 140. As a result, the fourth transistor 140 is turned on for a sufficient amount of time to ensure that the voltage level on the sense node 191 is pulled up prior to any subsequent read operation. Otherwise, the third wordline 216 remains high so that the fourth transistor 140 is off. As illustrated in the memory cells 101(4) of FIG. 1.4 and 101(5)

of FIG. 1.5, the fifth transistor 150 can be an NFET, which is connected between the intermediate node 192 and ground. This fifth transistor 150 can further include a fifth gate, which is connected to a fourth wordline 217. In this case, at power up, immediately following switching of the second transistor 120 to the high VT state, or under any other conditions where it is anticipated that the sense node 191 may be floating, a relatively short duration first positive voltage pulse (e.g., a VDD pulse, e.g., a 1V pulse) could be applied to the fourth wordline 217 and thereby to the fifth gate of the fifth transistor 150. As a result, the fifth transistor 150 is turned on for a sufficient amount of time to ensure that the voltage level on the intermediate node is pulled down such that the third transistor 130 is turned on and the voltage level on the sense node 191 is thereby pulled up prior to any subsequent read operation. Otherwise, the fourth wordline 217 remains low so that the fifth transistor 150 is off.

Alternatively, any other suitable technique could be employed in the memory cell 101(1) (e.g., where the first transistor 110 is a PFET and the second transistor 120 is an NFET with an electric field-based programmable threshold voltage) to raise the voltage on the sense node 191, at power up, etc. to avoid read errors due to a floating sense node 191.

Furthermore, it should be noted that floating sense node-induced read errors can similarly occur in the alternative memory cell embodiments of FIGS. 1.6-1.8. Thus, these memory cells can also optionally include additional components to prevent such errors. For example, the memory cells 101(6)-101(8) can also optionally include a third transistor 130 (i.e., a feedback transistor), which is connected in parallel with the first transistor 110 and which has a third gate connected to the intermediate node 192 between the first and second inverters 181-182. In the memory cells 101(6) and 101(7), this third transistor 130 is illustrated as being an NFET instead of a PFET. This is because in these embodiments, during a read operation, the first voltage source line 213 would receive a ground voltage pulse and the second voltage source line 214 would receive a positive voltage pulse. When the second transistor 120 has a high VT, the sense node 191 will be low, the output of the first inverter 181 will be high, the third transistor 130 will be on so that the sense node 191 continues to be pulled down (i.e., the third transistor 130 functions as a leaker transistor in this case). Otherwise, when the second transistor 120 has a low VT, the sense node 191 will be pulled up, the output of the inverter 181 will go low and the third transistor 130 will turn off.

As mentioned above, FIG. 2 is a schematic diagram illustrating an exemplary LUT 200 that can incorporate multiple threshold voltage (VT)-programmable field effect transistor (FET)-based memory cells 101 and, more particularly, that can incorporate multiple instances of any of the memory cells 101(1)-101(8) illustrated in FIGS. 1.1-1.8 and described in detail above.

The LUT 200 can include a set of memory cells 101 and, particularly, a set of threshold voltage (VT)-programmable field effect transistor (FET)-based memory cells (e.g., any of the memory cells 101(1)-101(8) described in detail above). In some embodiments, the LUT 200 can, for example, be configured to implement a combinational logic function. The combinational logic function can be any suitable combinational logic function designed to receive a fixed number (n) of two or more inputs (e.g., single-bit inputs of 1's and/or 0's) and to output at least one output (e.g., a single-bit output of 1 or 0) according to the truth table, which is associated with the combinational logic function and which specifies each output (i.e., a 1 or 0) for each combination of two or more inputs. The number of memory cells 101 is determined by the fixed number (n) of inputs to the combinational logic function at issue. For example, LUT implementation of a combinational logic function with n inputs and one output will require an LUT with $2^n$ memory cells 101. In any case, the memory cells 101 can be arranged in memory cell array 210, where each row (e.g., see rows R0-R2″) includes only one memory cell 101 and where each column (e.g., see columns C0-C2″) also includes only one memory cell 101. For example, the array 210 can include one memory cell 101 at R0-C0, one memory cell 101 at R1-C1, one memory cell 101 at R2-C2, and so on with a last memory cell 101 at R2″-C2″.

The LUT 200 can further include a controller 290 and peripheral circuitry 291-292 in communication with the controller 290, connected to the array 210, and configured to facilitate operation of the memory cells in different modes in response to control signals from the controller 290. As mentioned above, the disclosed memory cell can operate in multiple different operating modes. These operating modes can include: a read mode to output a stored data value; a first write mode (also referred to herein as a write 0 mode) to store a 0 data value; and a second write mode (also referred to herein as a write 1 mode) to store a 1 data value. As discussed above with regard to the various memory cell embodiments, specific combinations of different voltage pulses can be applied to the first wordline 211, the second wordline 212, the first voltage source line 213, and the second voltage source line 214 connected to a given memory cell in order to achieve the different operating modes (i.e., the read mode, the first write mode, and the second write mode) in the given memory cell. Furthermore, the specific combinations of the different voltages pulses vary depending on the conductivity types of the first and second transistors (e.g., a PFET and an NFET, respectively, as in the memory cells 101(1)-101(5); an NFET and a PFET, respectively, as in the memory cell 101(6); both NFETs, as in the memory cell 101(7); or both PFETs, as in the memory cell 101(8)) and also depending on the second transistor type (e.g., FeFET, CTFET, etc.).

To provide these different combinations of voltages pulses to the wordlines and the voltage source lines, the peripheral circuitry can include a row control block 291, which is electrically connected to the wordlines for the rows (see the first wordline 211 and the second wordline 212 for each row; see also the optional third wordline 216 for each row employed when the memory cells 101 are any of the memory cells 101(3) of FIG. 1.3 or 101(5) of FIG. 1.5; see also the optional fourth wordline 217 for each row employed when the memory cells 101 are any of the memory cells 101(4) of FIG. 1.4 of 101(5) of FIG. 1.5). The row control block 291 can include, for example, address decode logic and wordline drivers configured as follows: (a) to appropriately bias first wordlines 211 and second wordlines 212 during selective write 0 or write 1 operations and further during concurrent read operations; (b) to optionally appropriately bias first wordlines 211 at power up, immediately following switching of the second transistor 120 to the high VT state, or under any other conditions where it is anticipated that the sense node 191 may be floating in order to avoid read errors; and (c) to optionally appropriately bias third wordlines 216 and/or fourth wordlines 217 at power up, immediately following switching of the second transistor 120 to the high VT state, or under any other conditions where it is anticipated that the sense node 191 may be floating in order to avoid read errors. The peripheral circuitry can also include a column control block 292, which is electrically connected to source lines for the columns (see the first voltage source line 213 and the second voltage source line 214 for each column). The column control block 292 can include for example, column address decode logic and source line drivers for appropriately biasing the source lines of a selected memory cell depending upon the mode of operation. Such peripheral circuitry 291-292 capable of establishing different bias conditions on various lines connected to memory cells are well known in the art and, thus, the details thereof have been omitted from this specification in order to allow the reader to focus on the salient aspects of the disclosed embodiments related to the unique memory cell structure.

The LUT 200 can further include a multiplexing circuit 293, which is also connected to the memory array 210 and in communication with the controller 290. The multiplexing circuit 293 can be a $2^n$:1 multiplexing circuit that includes: n select line inputs 218 connected to the controller 290; $2^n$ data line inputs 215 connected to the output nodes of the $2^n$ memory cells, respectively; and a multiplexing circuit output node 219. Those skilled in the art will recognize that a $2^n$:1 multiplexing circuit can be configured as a $2^n$:1 multiplexor or its equivalent. For example, an 8:1 multiplexing circuit could be configured as a single 8:1 multiplexor, as a pair of 4:1 multiplexors with their respective outputs connected to another 2:1 multiplexor, etc.

As mentioned above, the LUT 200 can be configured to implement a combinational logic function. In this case, the peripheral circuitry 291-292 can be configured to facilitate selective and individual operation of any given memory cell 101 in the array 210 in a first write mode (i.e., a write 0 mode) or a second write mode (i.e., a write 1 mode) in response to control signals from the controller 290 in order to store, in the different memory cells 101, each output value of the combinational logic function for all possible combinations of n input values, as indicated by the truth table for the function. The peripheral circuitry 291-292 can further be configured to facilitate concurrent operation of all memory cells in the array 210 in a read mode in response to control signals from the controller 290 in order to concurrently read out the stored data from the memory cells 101 to the data input lines 215 of the multiplexing circuit 293.

The multiplexing circuit 293 can be configured to receive the stored data from the memory cells 101 on the data input lines 215, respectively, and to also receive a specific combination of n select values from the controller 290 on the n select line inputs 218, during the concurrent read operations. The specific combination of n select values on the n select line inputs 218 can be the same as a specific combination of n input values to the combinational logic function, as indicated in the truth table for the function. The multiplexing circuit 293 can further be configured to selectively output one specific output value (e.g., a 1 or a 0) to the multiplexing circuit output node 219. The specific output value can be read out from a specific memory cell 101 to a specific data line input 215, which is addressed by the specific combination of n select values on the n select line inputs 218. That is, in the LUT 200, the multiplexing circuit 293 can be configured so that the specific combination of n select values received on the n select line inputs 218 represent the address of a specific data line input 215 of the multiplexing circuit 293 (and thereby the address of a specific memory cell 101). The multiplexing circuit 293 can further be configured so that the stored data read out from the addressed memory cell 101 is passed to the multiplexing circuit output node 219. Multiplexing circuits configured as described above are well known in the art and, thus, the details thereof have been omitted from this specification in order to allow the reader to focus on the salient aspects of the disclosed inventions specifically related to the unique memory cell configuration.

Figures 5A, 5B:
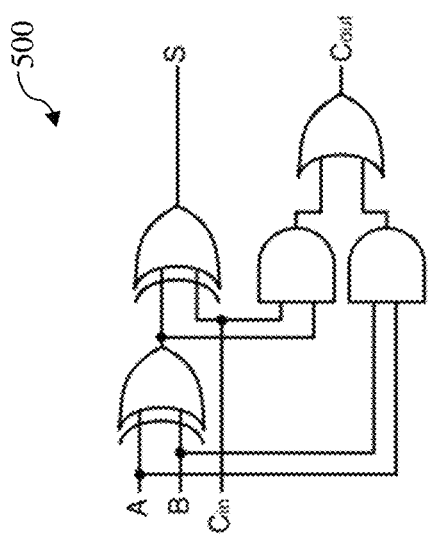
FIG. 5A is a schematic diagram illustrating a full adder circuit.
FIG. 5B is a truth table for the full adder circuit of FIG. 5A.

For example, consider the combination logic circuit and, particularly, the full adder circuit 500 shown in FIG. 5A. This full adder circuit 500 can be configured to receive 3 input values A, B, Cin that are 1's and/or 0's and, depending upon the particular combination of input values and the logic gates within the circuit, to output both a first output value S (e.g., a 1 or a 0) and a second output value Cout (e.g., a 1 or a 0). The truth table of FIG. 5B can indicate a different output value S for each of the eight possible combination of input values A, B and Cin (e.g., 000, 001, 010, etc.). The truth table of FIG. 5B can further indicate a different output value Cout for each of the eight possible combinations of input values A, B and Cin (e.g., 000, 001, 010, etc.). A pair of LUTs can be used to implement the full adder function: one LUT for output S (e.g., see the LUT in FIG. 5C) and another LUT for output Cout (e.g., see the LUT in FIG. 5D).

Figure 5C:
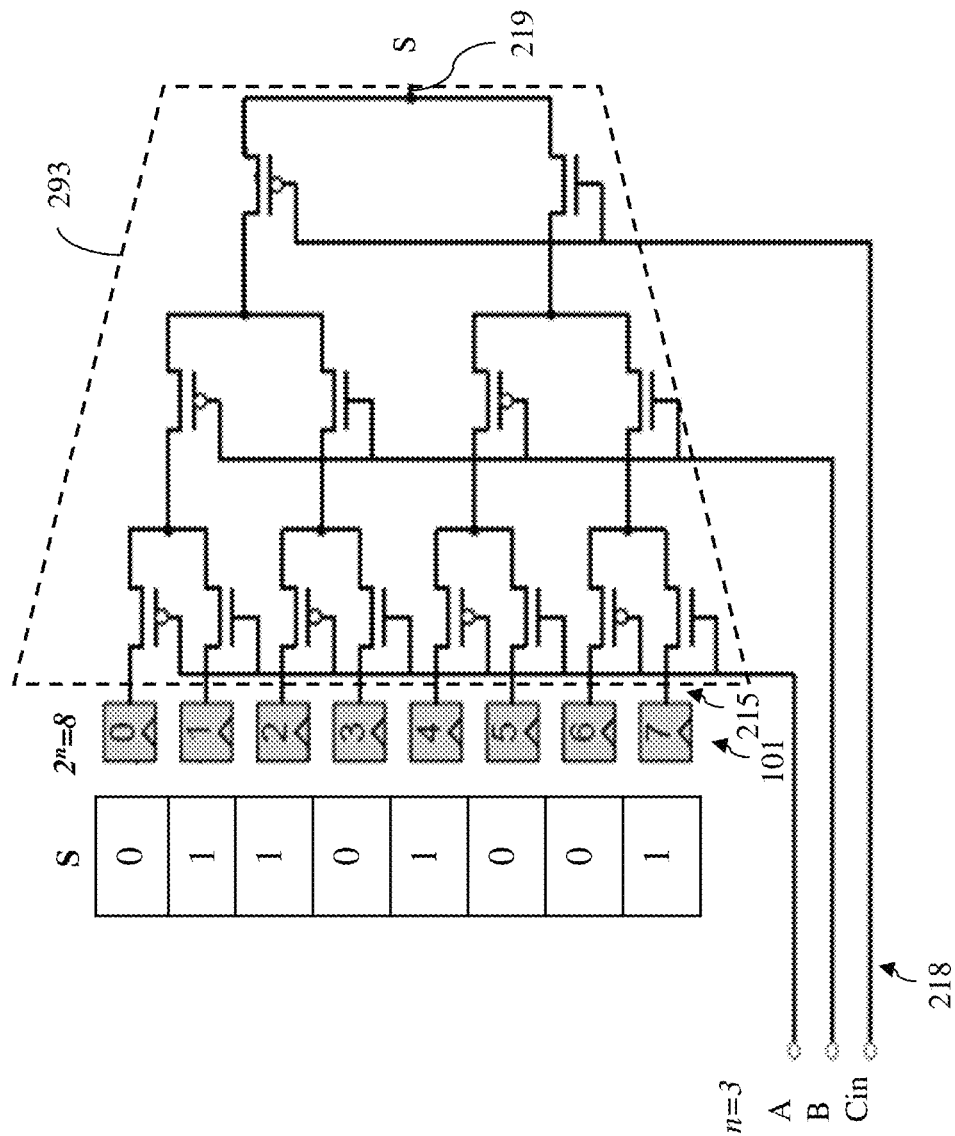
FIG. 5C is a disclosed embodiment of an LUT specifically for output S of the full adder circuit of FIG. 5A as indicated in the truth table of FIG. 5B.
Figure 5D:
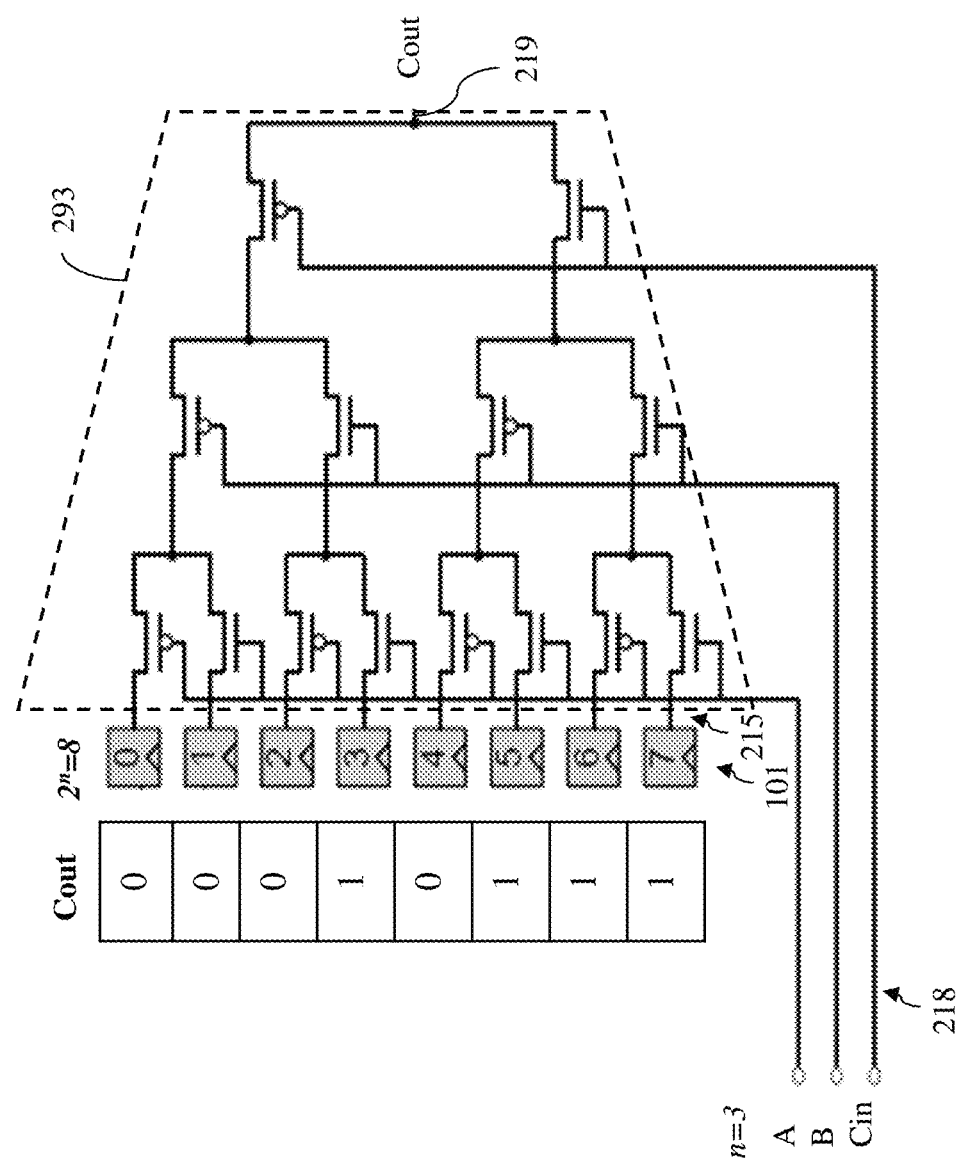
FIG. 5D is a disclosed embodiment of an LUT specifically for output C of the full adder circuit of FIG. 5A as indicated in the truth table of FIG. 5B.

In the LUT for output S, as shown in FIG. 5C, output values for S corresponding to the eight possible combinations of input values A, B and Cout, as indicated in the S column of the truth table of FIG. 5B, can be stored in eight memory cells 101 (identified as 0-7). The eight memory cells can be connected to eight data line inputs 215, respectively, of an 8:1 multiplexing circuit 293, which also has three select line inputs 218. The multiplexing circuit 293 can be configured to receive the stored data from the eight memory cells 101 on the eight data input lines 215, during a concurrent read operation, and further to receive a specific combination of three select values on the three select line inputs 218. The specific combination of three select values can be the same as a specific combination of three input values to the combinational logic function, as indicated in the truth table for the full adder function. The multiplexing circuit 293 can further be configured to selectively output a specific output value (e.g., a 1 or a 0) to the multiplexing circuit output node 219, based on that specific combination of three select values. The specific output value can be the stored data value, which has been read out from a specific memory cell 101 and applied to the specific data line input 215 addressed by the specific combination of three select values on the three select line inputs 218. Similarly, in LUT for output Cout, as shown in FIG. 5D, output values for Cout corresponding to the eight possible combinations of input values A, B and Cout, as indicated in the Cout column of the truth table of FIG. 5B, can be stored in eight memory cells 101 (identified as 0-7). The eight memory cells can be connected to eight data line inputs 215, respectively, of an 8:1 multiplexing circuit 293, which also has three select line inputs 218. The multiplexing circuit 293 can be configured to receive the stored data from the eight memory cells 101 on the eight data input lines 215, during a concurrent read operation, and further to receive a specific combination of three select values on the three select line inputs 218. The specific combination of three select values can be the same as a specific combination of three input values to the combinational logic function, as indicated in the truth table for the full adder function. The multiplexing circuit 293 can further be configured to selectively output a specific output value (e.g., a 1 or a 0) to the multiplexing circuit output node 219, based on that specific combination of three select values. The specific output value can be the stored data value, which has been read out from a specific memory cell 101 and applied to the specific data line input 215 addressed by the specific combination of three select values on the three select line inputs 218.

It should be noted that the LUTs for implementing a full adder function, as described above, are not intended to be limiting. Alternatively, the disclosed LUTs, which include multiple threshold voltage (VT)-programmable field effect transistor (FET)-based memory cells, can be employed to implement any other type of combinational logic function.

Figure 6:
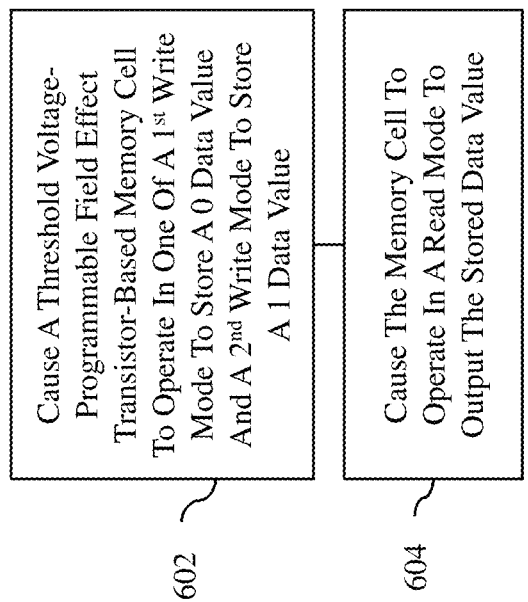
FIG. 6 is a flow diagram illustrating method embodiments for operating the disclosed threshold voltage (VT)-programmable field effect transistor (FET)-based memory cell embodiments.
Figure 7:
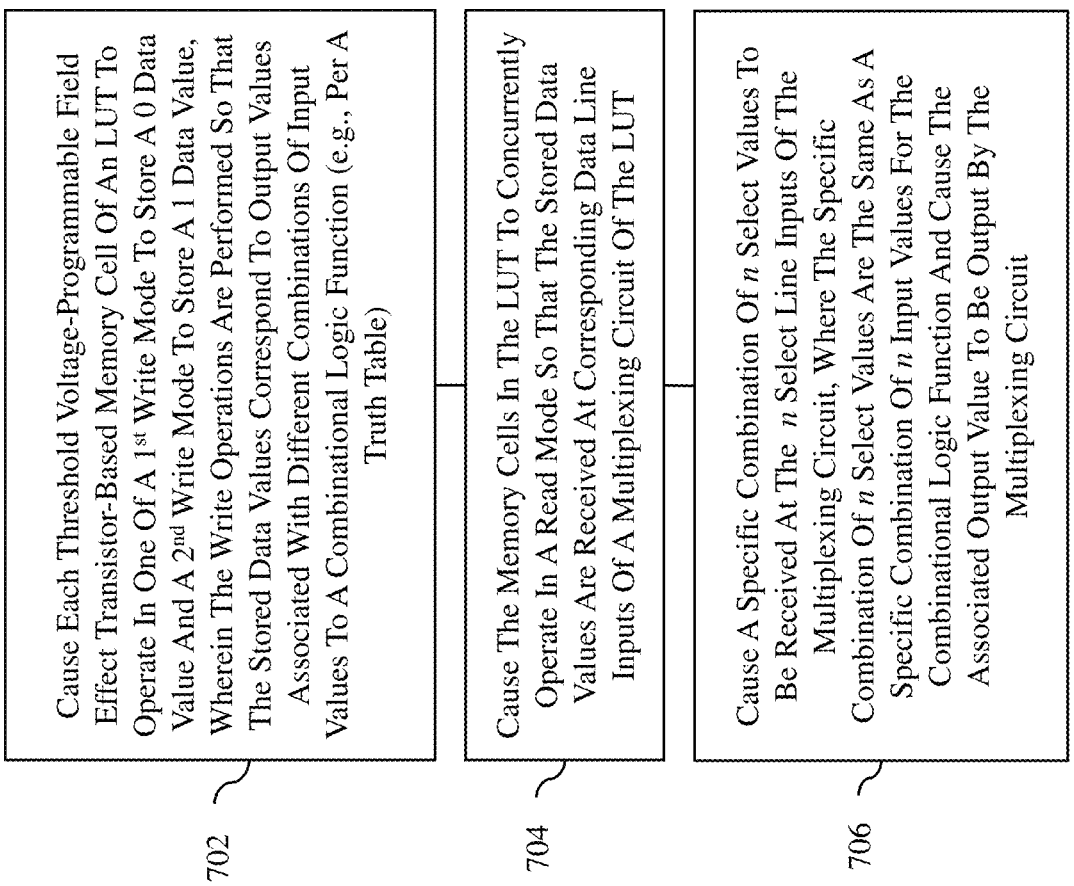
FIG. 7 is a flow diagram illustrating method embodiments for operating the disclosed LUT embodiments.

Also disclosed herein are associated method embodiments including method embodiments for operating a threshold voltage (VT)-programmable field effect transistor (FET)-based memory cell, as illustrated in the flow diagram of FIG. 6, and method embodiments for operating a look-up table (LUT) that incorporates a multiplexing circuit and multiple threshold voltage (VT)-programmable field effect transistor (FET)-based memory cells, as indicated in the flow diagram of FIG. 7.

Specifically, disclosed herein are embodiments of a method for operating a threshold voltage (VT)-programmable field effect transistor (FET)-based memory cell, as illustrated in the flow diagram of FIG. 6. The method can include accessing a memory cell to perform write and read operations. The memory cell can be configured essentially the same as any of the memory cells 101(1)-101(8), described in detail above and illustrated in FIGS. 1.1-1.8. However, for purposes of illustration, these method embodiments are described below with reference to the memory cells 101(1)-101(5) of FIGS. 1.1-1.5.

The method can further include causing the memory cell to operate in either a first write mode (also referred to herein as a write 0 mode) or a second write mode (also referred to herein as a write 1 mode) (see process 602). Specifically, the first write mode programs the second transistor 120 to have a first VT (i.e., a low VT) for storage of a first data value (e.g., a 0 data value). The second write mode programs the second transistor 120 to have a second VT (i.e., a high VT) that is different from (e.g., higher than) the first VT for storage of a second data value (e.g., a 1 data value). The method can further include causing the memory cell to operate in a read mode (see process 604). Operation in the read mode can be performed such that, during the read mode, a voltage level on the sense node 191 indicates that the second transistor 120 has either the first VT (and thus is storing the first data value) or the second VT (and thus is storing the second data value).

The different operating modes (i.e., the read mode, the first write mode, and the second write mode) in a given memory cell can be achieved using specific combinations of voltage pulses applied to the first wordline 211, the second wordline 212, the first voltage source line 213, and the second voltage source line 214 connected to that given memory cell. Furthermore, the specific combinations of voltage pulses will vary depending on the conductivity types of the first and second transistors (e.g., PFET and NFET, respectively, as in the memory cells 101(1)-101(5) of FIGS. 1.1-1.5; NFET and PFET, respectively, as in the memory cell 101(6) of FIG. 1.6; both NFETs as in the memory cell 101(7) of FIG. 1.7; or both PFETs as in the memory cell 101(8) of FIG. 1.8) and further depending on the second transistor type (e.g., FeFET, CTFET, etc.).

For example, consider a memory cell where the first transistor 110 is a PFET and where the second transistor 120 is NFET (e.g., such as any of the memory cells 101(1)-101(5) of FIGS. 1.1-1.5) and further where the second transistor 120 is specifically an N-type FeFET, as described above and illustrated in FIGS. 3A-3B.

In the read mode at process 604, a combination of voltage pulses can be applied to the first wordline 211, the second wordline 212, the first voltage source line 213, and the second voltage source line 214 connected to the memory cell so that: (a) when the FeFET has a low VT (e.g., a VT of 0V), the voltage level on the sense node 191 is pulled down to a low voltage level, the output of the first inverter 181 is high, and the output of the second inverter 182 and, thereby the output on the memory cell output node 195 is low (i.e., indicating a stored 0 data value); and (b) when the FeFET has a high VT (e.g., a VT of 1.5V), the voltage level on the sense node 191 is pulled up to a high voltage level, the output of the first inverter 181 is low, and the output of the second inverter 182 and, thereby the output on the memory cell output node 195 is high (i.e., indicating a stored 1 data value). To accomplish this read mode, a first positive voltage pulse (e.g., a VDD pulse; e.g., a 1V pulse) can be applied to the first wordline 211, the second wordline 212, and the first voltage source line 213 and a ground voltage pulse (e.g., a VSS pulse, e.g., a 0V pulse) can be applied to the second voltage source line 214. As a result, the first transistor 110 (which as mentioned above is a PFET) turns off. Furthermore, if the second transistor 120 (which as mentioned above is a FeFET in this example) has the first VT (i.e., a low VT), the voltage level on the sense node 191 will be pulled down to a low voltage level; whereas, if the second transistor 120 has the second VT (i.e., a high VT), the voltage level on the sense node 191 will be pulled up to a high voltage level. As discussed above with regard to the structure embodiments, it should be understood that the first transistor 110 should be sized so that, when it is turned off, it: (a) allows the voltage level on the sense node 191 to be pulled down when the second transistor 120 has the first VT (i.e., the low VT); and (b) pulls up the voltage level on the sense node 191 when the second transistor 120 has the second VT (i.e., the high VT).

In a first write mode (i.e., the write 0 mode) at process 602, a different combination of voltage pulses can be applied to the first wordline 211, the second wordline 212, the first voltage source line 213, and the second voltage source line 214 so that electric field-induced switching to the first VT (i.e., to the low VT) occurs. To accomplish this first write mode, a second positive voltage pulse that is at a higher level than the first positive voltage pulse (e.g., a VDD+ pulse; e.g., a 2.5V pulse) can be applied to the second wordline 212 and a ground voltage pulse (e.g., a VSS pulse, e.g., a 0V pulse) can be applied to each of the first wordline 211, the first voltage source line 213, and the second voltage source line 214. As a result, the first transistor 110 is turned on and the FeFET-type second transistor 120 receives the ground voltage pulses on its N+ source/drain regions and the second positive voltage pulse on its gate such that it is programmed to have the first VT (i.e., the low VT, e.g., a VT of 0V).

Alternatively, in a second write mode (i.e., the write 1 mode) at process 602, yet another different combination of voltage pulses can be applied to the first wordline 211, the second wordline 212, the first voltage source line 213, and the second voltage source line 214 can be set so that electric field-induced switching to the second VT (i.e., to the high VT) occurs. To accomplish this second write mode, ground voltage pulses (e.g., VSS pulses, e.g., 0V pulses) can be the first wordline 211 and to the second wordline 212 and second positive voltage pulses (e.g., VDD+ pulses, e.g., 2.5V pulses) can be applied to the first voltage source line 213 and the second voltage source line 214. As a result, the first transistor 110 is turned on and the FeFET-type second transistor 120 receives the second positive voltage pulses on its N+ source/drain regions and the ground voltage pulse on its gate such that it is programmed to have the second VT (i.e., the high VT, e.g., a VT of 1.5V).

It should be noted that additional processes can include causing the voltage level on the sense node 191 to be pulled up, as needed, in order to minimize floating sense node-induced read errors (i.e., to minimize the risk of the occurrence of a floating sense node-induced read error during a read operation of a given memory cell). For example, in some embodiments of the method, in order to minimize the risk of a floating sense node-induced read error, a relatively short duration ground voltage pulse can be applied to the first wordline 211 (and thereby to the first gate of the first transistor 110) at power up, immediately following switching of the second transistor 120 to the high VT state, or under any other conditions where it is anticipated that the sense node 191 may be floating. In other embodiments, additional components can be incorporated into the memory cell in order to minimize the risk of a floating sense node-induced read errors.

For example, referring to the memory cells 101(2)-101(5) of FIGS. 1.2-1.5, in some embodiments, a third transistor 130 (also referred to herein as feedback transistor and in this case a keeper transistor) can be incorporated into the memory cell. As discussed in detail above, this third transistor 130 can be an additional PFET, which is connected parallel with the first transistor 110 between the first voltage source line 213 and the sense node 191 (e.g., at the input to the first inverter 181). This third transistor 130 can further include a third gate, which is connected to an intermediate node 192 between the first inverter 181 and the second inverter 182 (i.e., at the output of the first inverter 181 and at the input of the second inverter 182). In other words, the third gate of this third transistor 130 is continuously biased by the voltage level on the intermediate node 192 such that it turns on whenever the output of the first inverter 181 is low to boost the voltage level at the sense node 191 and turns off whenever the output of the first inverter 181 is high.

Additionally, or alternatively, referring specifically to the memory cells 101(3)-101(5) of FIGS. 1.3-1.5, in some embodiments, the memory cell can further include a fourth transistor 140 and/or a fifth transistor 150. For example, as illustrated in the memory cells 101(3) of FIG. 1.3 and 101(5) of FIG. 1.5, the fourth transistor 140 can be yet another PFET, which is connected parallel with the first transistor 110 between the first voltage source line 213 and the sense node 191 (e.g., at the input to the first inverter 181). This fourth transistor 140 can further include a fourth gate, which is connected to a third wordline 216. In this case, at power up, immediately following switching of the second transistor 120 to the high VT state, or under any other conditions where it is anticipated that the sense node 191 may be floating, a relatively short duration ground voltage pulse could be applied to the third wordline 216 and thereby to the fourth gate of the fourth transistor 140. As a result, the fourth transistor 140 is turned on for a sufficient amount of time to ensure that the voltage level on the sense node 191 is pulled up prior to any subsequent read operation. Otherwise, the third wordline 216 remains high so that the fourth transistor 140 is off. Additionally, or alternatively, as illustrated in the memory cells 101(4) of FIG. 1.4 and 101(5) of FIG. 1.5, the fifth transistor 150 can be an NFET, which is connected between the intermediate node 192 and ground. This fifth transistor 150 can further include a fifth gate, which is connected to a fourth wordline 217. In this case, at power up, immediately following switching of the second transistor 120 to the high VT state, or under any other conditions where it is anticipated that the sense node 191 may be floating, a relatively short duration first positive voltage pulse (e.g., a VDD pulse, e.g., a 1V pulse) could be applied to the fourth wordline 217 and thereby to the fifth gate of the fifth transistor 150. As a result, the fifth transistor 150 is turned on for a sufficient amount of time to ensure that the voltage level on the intermediate node is pulled down such that the third transistor 130 is turned on and the voltage level on the sense node 191 is thereby pulled up prior to any subsequent read operation. Otherwise, the fourth wordline 217 remains low so that the fifth transistor 150 is off.

Also disclosed herein are method embodiments for operating a look-up table (LUT) that incorporates a multiplexing circuit and multiple threshold voltage (VT)-programmable field effect transistor (FET)-based memory cells, as illustrated in the flow diagram of FIG. 7. Specifically, referring to FIG. 7, the method can include accessing memory cells in the LUT to perform write and read operations. The LUT can be configured essentially the same as the LUT 200, described above and illustrated in FIG. 2, with a multiplexing circuit 293 and multiple memory cells 101. The memory cells can be configured essentially the same as any of the memory cells 101(1)-101(8), described in detail above and illustrated in FIGS. 1.1-1.8. However, for purposes of illustration, these method embodiments are described below with reference to the memory cells 101(1)-101(5) of FIGS. 1.1-1.5.

The method can further include selectively and individually causing each memory cell 101 to operate in either a first write mode (also referred to herein as a write 0 mode) or a second write mode (also referred to herein as a write 1 mode) (see process 702). Specifically, the first write mode programs the second transistor 120 of a memory cell 101 to have a first VT (i.e., a low VT) for storage of a first data value (e.g., a 0 data value). The second write mode programs the second transistor 120 of a memory cell 101 to have a second VT (i.e., a high VT) that is higher than the first VT for storage of a second data value (e.g., a 1 data value). Each selective write operation can be performed essentially the same as either the first write operation or the second write operation discussed above with respect to process 602. Furthermore, these selective write operations can be performed so that the stored data values in the memory cells 101 of the LUT 200 correspond to output values associated with different combinations of input values to a combinational logic function (e.g., as indicated by a corresponding truth table). As mentioned above with regard to the structure embodiments, LUT implementation of a combinational logic function with n inputs and one output will require an LUT 200 with $2^n$ memory cells and a $2^n$:1 multiplexer or the equivalent.

The method can further include causing the $2^n$ memory cells 101 to concurrently operate in a read mode (see process 704). Operation of each memory cell 101 in the read mode can be performed essentially the same as discussed above with respect to process 604 such that, in any given memory cell, the voltage level on the sense node 191 is pulled down when the second transistor 120 has the first VT indicating storage of the first data value and pulled up when the second transistor 120 has the second VT indicating storage of the second data value. Concurrent operation of the $2^n$ memory cells in the read mode can be performed such that the stored data values from the memory cells are concurrently applied to the corresponding $2^n$ data input lines of the multiplexing circuit 293.

The method can further include causing a specific combination of n select values to be received at the n select line inputs 218 of the multiplexing circuit 293 during the concurrent read operation (see process 706). The specific combination of n select values on the n select line inputs 218 can be the same as a specific combination of n input values to the combinational logic function, as indicated in the truth table for the function. Receipt of the specific combination of n select values can cause the multiplexing circuit 293 to selectively output one specific output value (e.g., a 1 or a 0) to the multiplexing circuit output node 219. The specific output value can be read out from a specific memory cell 101 to a specific data line input 215, which is addressed by the specific combination of n select values on the n select line inputs 218. That is, in the LUT 200, the multiplexing circuit 293 can be configured so that the specific combination of n select values received on the n select line inputs 218 represent the address of a specific data line input 215 of the multiplexing circuit 293 (and thereby the address of a specific memory cell 101). The multiplexing circuit 293 can further be configured so that the stored data read out from the addressed memory cell 101 is passed to the multiplexing circuit output node 219.

It should be noted that the various processes set forth in the flow diagrams of FIG. 6 and FIG. 7 can be caused (and, more particularly, controlled) by a controller, which sends control signals to the peripheral circuitry, which biases the various wordlines and source lines connected to each memory cell, and which also, in the case of the LUT, sends the n select values to the multiplexing circuit.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a multiplexing circuit including: multiple data line inputs; multiple select line inputs; and a multiplexing circuit output node; and
    multiple memory cells, wherein each memory cell includes:
        a first transistor;
        a second transistor, wherein the second transistor has an electric field-based programmable threshold voltage and wherein the first transistor and the second transistor are connected in series between a first voltage source line and a second voltage source line;
        a sense node at a junction between the first transistor and the second transistor;
        a memory cell output node;
        a first inverter; and
        a second inverter, wherein the first inverter and the second inverter are connected in series between the sense node and the memory cell output node and wherein the memory cell output node is connected to one of the data line inputs of the multiplexing circuit.

2. The structure of claim 1, wherein, within each memory cell, the second transistor is any of a ferroelectric field effect transistor, a charge trap field effect transistor, and any other type of field effect transistor configured for electric field-induced threshold voltage switching.

3. The structure of claim 1, wherein each memory cell further includes a third transistor connected in parallel with the first transistor between the first voltage source line and the sense node, wherein the first transistor includes a first gate connected to a first wordline, wherein the second transistor includes a second gate connected to a second wordline, and wherein the third transistor includes a third gate connected to an intermediate node between the first inverter and the second inverter.

4. The structure of claim 3, wherein, within each memory cell, the first transistor is a p-type field effect transistor, the second transistor is an n-type field effect transistor, and the third transistor is an additional n-type field effect transistor.

5. The structure of claim 4, wherein each memory cell further includes any of:
    a fourth transistor, wherein the fourth transistor is another additional p-type field effect transistor and wherein the fourth transistor is connected in parallel with the first transistor and the third transistor between the first voltage source line and the sense node; and
    a fifth transistor, wherein the fifth transistor is an additional n-type field effect transistor connected between the intermediate node and ground.

6. The structure of claim 1,
    wherein the memory cells are concurrently operable in a read mode and individually operable in any of a first write mode and a second write mode,
    wherein the first write mode and the second write mode are employed to store, within the memory cells, output values associated with different combinations of input values, respectively, for a combinational logic function, and wherein the read mode is employed to apply the output values to the data line inputs of the multiplexing circuit so that, in response to also receiving a specific combination of select values at the select line inputs, the multiplexing circuit outputs a specific output value read from a specific memory cell.

7. The structure of claim 6, further comprising:
peripheral circuitry; and
a controller in communication with the peripheral circuitry,
wherein, in each memory cell, the first transistor is a p-type field effect transistor and has a first gate connected to a first wordline, and the second transistor is an n-type ferroelectric field effect transistor and has a second gate connected to a second wordline, and
wherein operating modes of each memory cell vary depending upon voltage pulses applied by the peripheral circuitry to the first wordline, the second wordline, the first voltage source line, and the second voltage source line connected to the memory cell in response to control signals from the controller.

8. The structure of claim 7,
wherein, during a read mode in the memory cell, the peripheral circuitry causes the first wordline, the second wordline, and the first voltage source line to each receive a first positive voltage pulse and further causes the second voltage source line to receive a ground voltage pulse so that the sense node of the memory cell is pulled down indicating storage of a first data value when the second transistor has a first threshold voltage and so that the sense node is pulled up indicating storage of a second data value that is different from the first data value when the second transistor has a second threshold voltage that is higher than the first threshold voltage.

9. The structure of claim 7,
wherein, during a first write mode in the memory cell, the peripheral circuitry causes the second wordline to receive a second positive voltage pulse that is at a higher level than the first positive voltage pulse and further causes the first wordline, the first voltage source line, and the second voltage source line to each receive the ground voltage pulse so that the second transistor is programmed to have the first threshold voltage, and
wherein, during a second write mode in the memory cell, the peripheral circuitry causes the first wordline and the second wordline to each receive the ground voltage pulse and further causes the first voltage source line and the second voltage source line to each receive the second positive voltage pulse so that the second transistor is programmed to have the second threshold voltage.

10. The structure of claim 1,
wherein, within each memory cell, the first transistor is an n-type field effect transistor and the second transistor is a p-type field effect transistor,
wherein, within each memory cell, the first transistor and the second transistor are n-type field effect transistors, or
wherein, within each memory cell, the first transistor and the second transistor are p-type field effect transistors.

11. A structure comprising:
a multiplexing circuit including: multiple data line inputs; multiple select line inputs; and a multiplexing circuit output node; and
multiple memory cells, wherein each memory cell includes:
a first transistor;
a second transistor, wherein the second transistor has an electric field-based programmable threshold voltage, wherein the first transistor and the second transistor are connected in series between a first voltage source line and a second voltage source line, and wherein the first transistor has a first gate connected to a first wordline and the second transistor has a second gate connected to a second wordline;
a sense node at a junction between the first transistor and the second transistor;
a memory cell output node;
a first inverter; and
a second inverter, wherein the first inverter and the second inverter are connected in series between the sense node and the memory cell output node and wherein the memory cell output node is connected to one of the data line inputs of the multiplexing circuit.

12. The structure of claim 11, wherein, within each memory cell, the second transistor is any of a ferroelectric field effect transistor, a charge trap field effect transistor, and any other type of field effect transistor configured for electric field-induced threshold voltage switching.

13. The structure of claim 11, wherein each memory cell further includes a third transistor connected in parallel with the first transistor between the first voltage source line and the sense node, wherein the first transistor includes a first gate connected to a first wordline, wherein the second transistor includes a second gate connected to a second wordline, and wherein the third transistor includes a third gate connected to an intermediate node between the first inverter and the second inverter.

14. The structure of claim 13, wherein, within each memory cell, the first transistor is a p-type field effect transistor, the second transistor is an n-type field effect transistor, and the third transistor is an additional n-type field effect transistor.

15. The structure of claim 14, wherein each memory cell further includes any of:
a fourth transistor, wherein the fourth transistor is another additional p-type field effect transistor and wherein the fourth transistor is connected in parallel with the first transistor and the third transistor between the first voltage source line and the sense node; and
a fifth transistor, wherein the fifth transistor is an additional n-type field effect transistor connected between the intermediate node and ground.

16. The structure of claim 11,
wherein the memory cells are concurrently operable in a read mode and individually operable in any of a first write mode and a second write mode,
wherein the first write mode and the second write mode are employed to store, within the memory cells, output values associated with different combinations of input values, respectively, for a combinational logic function, and
wherein the read mode is employed to apply the output values to the data line inputs of the multiplexing circuit so that, in response to also receiving a specific combination of select values at the select line inputs, the multiplexing circuit outputs a specific output value read from a specific memory cell.

17. The structure of claim 16, further comprising: peripheral circuitry; and a controller in communication with the peripheral circuitry, wherein, in each memory cell, the first transistor is a p-type field effect transistor and the second transistor is an n-type ferroelectric field effect transistor, and wherein operating modes of each memory cell vary depending upon voltage pulses applied by the peripheral circuitry to the first wordline, the second wordline, the first voltage source line, and the second voltage source line connected to the memory cell in response to control signals from the controller.

18. The structure of claim 17, wherein, during a read mode in the memory cell, the peripheral circuitry causes the first wordline, the second wordline, and the first voltage source line to each receive a first positive voltage pulse and further causes the second voltage source line to receive a ground voltage pulse so that the sense node of the memory cell is pulled down indicating storage of a first data value when the second transistor has a first threshold voltage and so that the sense node is pulled up indicating storage of a second data value that is different from the first data value when the second transistor has a second threshold voltage that is higher than the first threshold voltage, wherein, during a first write mode in the memory cell, the peripheral circuitry causes the second wordline to receive a second positive voltage pulse that is at a higher level than the first positive voltage pulse and further causes the first wordline, the first voltage source line, and the second voltage source line to each receive the ground voltage pulse so that the second transistor is programmed to have the first threshold voltage, and wherein, during a second write mode in the memory cell, the peripheral circuitry causes the first wordline and the second wordline to each receive the ground voltage pulse and further causes the first voltage source line and the second voltage source line to each receive the second positive voltage pulse so that the second transistor is programmed to have the second threshold voltage.

19. The structure of claim 11, wherein, within each memory cell, the first transistor is an n-type field effect transistor and the second transistor is a p-type field effect transistor, wherein, within each memory cell, the first transistor and the second transistor are n-type field effect transistors, or wherein, within each memory cell, the first transistor and the second transistor are p-type field effect transistors.

20. A structure comprising:

a multiplexing circuit including: multiple data line inputs; multiple select line inputs; and a multiplexing circuit output node; and multiple memory cells, wherein each memory cell includes:
  a first transistor;
  a second transistor, wherein the second transistor has an electric field-based programmable threshold voltage,
    wherein the first transistor and the second transistor are connected in series between a first voltage source line and a second voltage source line,
    wherein the first transistor has a first gate connected to a first wordline and the second transistor has a second gate connected to a second wordline, and
    wherein operating modes vary depending upon voltage pulses on the first wordline, the second wordline, the first voltage source line, and the second voltage source line;
  a sense node at a junction between the first transistor and the second transistor;
  a memory cell output node;
  a first inverter; and
  a second inverter, wherein the first inverter and the second inverter are connected in series between the sense node and the memory cell output node and wherein the memory cell output node is connected to one of the data line inputs of the multiplexing circuit.

* * * * *